US009292639B1

(12) United States Patent
Elmufdi et al.

(10) Patent No.: US 9,292,639 B1
(45) Date of Patent: Mar. 22, 2016

(54) METHOD AND SYSTEM FOR PROVIDING ADDITIONAL LOOK-UP TABLES

(71) Applicant: Cadence Design Systems, Inc., San Jose, CA (US)

(72) Inventors: Beshara Elmufdi, San Jose, CA (US); Viktor Salitrennik, Berkeley, CA (US); Mitchell G. Poplack, San Jose, CA (US)

(73) Assignee: CADENCE DESIGN SYSTEMS INC., San Jose, CA (US)

( * ) Notice: Subject to any disclaimer, the term of this patent is extended or adjusted under 35 U.S.C. 154(b) by 0 days.

(21) Appl. No.: 14/529,076

(22) Filed: Oct. 30, 2014

(51) Int. Cl.
*G06F 17/50* (2006.01)
*G06F 12/08* (2006.01)
*G06F 12/02* (2006.01)
*G06F 12/06* (2006.01)

(52) U.S. Cl.
CPC ........ *G06F 17/5045* (2013.01); *G06F 17/5027* (2013.01); *G06F 12/02* (2013.01); *G06F 12/06* (2013.01); *G06F 12/08* (2013.01)

(58) Field of Classification Search
CPC ..... G06F 12/02; G06F 12/08; G06F 17/5027; G06F 17/5045
USPC .................................. 703/23; 716/100, 132
See application file for complete search history.

(56) References Cited

U.S. PATENT DOCUMENTS

| | | | |
|---|---|---|---|
| 5,036,473 A | 7/1991 | Butts et al. | |
| 5,109,353 A | 4/1992 | Sample et al. | |
| 5,475,830 A | 12/1995 | Chen et al. | |
| 5,551,013 A | 8/1996 | Beausoleil et al. | |
| 5,960,191 A | 9/1999 | Sample et al. | |
| 6,009,256 A | 12/1999 | Tseng et al. | |
| 6,035,117 A | 3/2000 | Beausoleil et al. | |
| 6,051,030 A | 4/2000 | Beausoleil et al. | |
| 6,618,698 B1 | 9/2003 | Beausoleil et al. | |
| 7,739,093 B2 | 6/2010 | Beausoleil et al. | |
| 8,255,201 B2 * | 8/2012 | Wang .................. | G06F 9/45537 703/23 |
| 9,171,111 B1 * | 10/2015 | Elmufdi ............... | G06F 17/5027 |
| 2005/0192791 A1 * | 9/2005 | Mayer ................. | G06F 11/3652 703/28 |
| 2006/0143522 A1 * | 6/2006 | Multhaup ............ | G06F 11/261 714/28 |
| 2006/0170993 A1 * | 8/2006 | Jacob ................... | H04N 1/6011 358/518 |
| 2008/0082310 A1 * | 4/2008 | Sandorfi ............. | G06F 11/1456 703/23 |
| 2008/0104375 A1 * | 5/2008 | Hansen ............... | G06F 9/30018 712/220 |
| 2008/0215305 A1 * | 9/2008 | Bishop ................ | G06F 12/1009 703/15 |
| 2009/0292523 A1 * | 11/2009 | Birguer ............... | G06F 9/45537 703/23 |
| 2011/0072203 A1 * | 3/2011 | Corda .................. | G06Q 20/045 711/103 |
| 2011/0161542 A1 * | 6/2011 | Fleming .................. | G06F 13/24 710/262 |
| 2012/0265517 A1 * | 10/2012 | Zbiciak ................... | G06F 13/36 703/28 |
| 2012/0320692 A1 * | 12/2012 | Schmitt ............... | G06F 17/5027 365/189.17 |
| 2013/0124183 A1 * | 5/2013 | Braun ................. | G06F 17/5022 703/14 |
| 2014/0006724 A1 * | 1/2014 | Gray ....................... | G06F 12/00 711/147 |
| 2014/0047197 A1 * | 2/2014 | Kokrady .................. | G11C 8/16 711/149 |
| 2014/0297938 A1 * | 10/2014 | Puthiyedath ............ | G06F 12/08 711/105 |

* cited by examiner

*Primary Examiner* — Stacy Whitmore
(74) *Attorney, Agent, or Firm* — Kaye Scholer LLP

(57) ABSTRACT

A method and system of providing additional lookup tables in an emulation processor cluster of an emulation chip of a hardware functional verification system is provided. An indirection table may be used within the processor cluster to provide the commonly-used function tables for the lookup tables (LUTs). The indirection table may be indexed according to a smaller portion of the standard LUT function table provided by an instruction than otherwise needed. The unused function table bits in the instruction may then be used for other purposes, including providing functionality to one or more extra LUTs of the processor cluster, whose function tables may be provided from another indirection table provided for that purpose. Additional processing capacity may thereby be provided for the cluster with a small amount of additional overhead within the emulation chip, while still providing the full range of function tables of the LUTs.

20 Claims, 6 Drawing Sheets

METHOD AND SYSTEM FOR PROVIDING ADDITIONAL LOOK-UP TABLES

FIELD

This patent document relates generally to the field of verifying the functionality of integrated circuit designs prior to fabrication. In particular, the present patent document relates to systems and methods for providing additional lookup tables in an emulation chip of a hardware functional verification system.

BACKGROUND

Functional verification systems, including hardware emulation systems and simulation acceleration systems, utilize interconnected programmable logic chips or interconnected processor chips. Examples of systems using programmable logic devices are disclosed in, for example, U.S. Pat. No. 6,009,256 entitled "Simulation/Emulation System and Method," U.S. Pat. No. 5,109,353 entitled "Apparatus for emulation of electronic hardware system," U.S. Pat. No. 5,036,473 entitled "Method of using electronically reconfigurable logic circuits," U.S. Pat. No. 5,475,830 entitled "Structure and method for providing a reconfigurable emulation circuit without hold time violations," and U.S. Pat. No. 5,960,191 entitled "Emulation system with time-multiplexed interconnect." U.S. Pat. Nos. 6,009,256, 5,109,353, 5,036,473, 5,475,830, and 5,960,191 are incorporated herein by reference. Examples of hardware logic emulation systems using processor chips are disclosed in, for example, U.S. Pat. No. 6,618,698 "Clustered processors in an emulation engine," U.S. Pat. No. 5,551,013 entitled "Multiprocessor for hardware emulation," U.S. Pat. No. 6,035,117 entitled "Tightly coupled emulation processors," U.S. Pat. No. 6,051,030 entitled "Emulation module having planar array organization," and U.S. Pat. No. 7,739,093 entitled "Method of visualization in processor based emulation system." U.S. Pat. Nos. 6,618,698, 5,551,013, 6,035,117, 6,051,030, and 7,739,093 are incorporated herein by reference.

Functional verification systems help to shorten the time it takes to design a customized application specific integrated circuit (ASIC) by allowing designers to emulate the functionality of the ASIC before a production run has begun. Functional verification systems help to ensure ASICs are designed correctly the first time, before a final product is produced.

A functional verification system or hardware emulator generally comprises a computer workstation for providing emulation support facilities, i.e., emulation software, a compiler, and a graphical user interface to allow a person to program the emulator, and an emulation engine for performing the emulation. The emulation engine is comprised of at least one emulation board, and each emulation board contains individual emulation circuits. Each individual emulation circuit contains multiple emulation processors, and each emulation processor is capable of mimicking a logic gate in each emulation step.

Increases in processor capacity are often desirable while minimizing the area used on a chip. Thus, for at least these reasons there is a need for an improved method and apparatus for providing additional capacity in the form of additional lookup tables in hardware functional verification systems.

SUMMARY

Systems and methods for providing additional lookup tables in an emulation chip of a hardware functional verification system are disclosed and claimed herein.

As described more fully below, the apparatus and processes of the embodiments disclosed permit improved systems and methods in an emulation chip of a hardware functional verification system. Further aspects, objects, desirable features, and advantages of the apparatus and methods disclosed herein will be better understood and apparent to one skilled in the relevant art in view of the detailed description and drawings that follow, in which various embodiments are illustrated by way of example. It is to be expressly understood, however, that the drawings are for the purpose of illustration only and are not intended as a definition of the limits of the claimed embodiments.

To this end, systems and methods for providing additional lookup tables in an emulation chip of a hardware functional verification system are provided.

In one form, a hardware functional verification system is provided, the hardware functional verification system comprising a plurality of interconnected emulation chips, at least one of the emulation chips comprising: a plurality of hardware functional verification resources, an emulation processor cluster of the emulation chip comprising: a first plurality of lookup tables; a second lookup table; a data array to s ore a plurality of lookup table select bits to be provided to the first plurality of lookup tables and the second lookup table according to a plurality of memory read addresses; and an instruction memory to store a set of instructions for each of the first plurality of lookup tables and the second lookup table, wherein each instruction includes a plurality of memory read address bits, a first plurality of lookup table function bits, a second plurality of lookup table function bits, and an indirection enable bit; wherein the indirection enable bit when set causes the first plurality of lookup table function bits to be provided as inputs to the first plurality of lookup tables and causes the second plurality of lookup table function bits to be provided as inputs to the second lookup table, wherein the indirection enable bit when not set causes both the first plurality of lookup table function bits and the second plurality of lookup table function bits to be provided as inputs to the first plurality of lookup tables.

In some embodiments, the data array comprises a plurality of data memories. In certain embodiments, the data memories operate twice per emulation step. In some embodiments, the data memories output the second plurality of lookup table function bits to the second lookup table over every other emulation step. In certain embodiments, the data memories output the first plurality of lookup table function bits to the first plurality of lookup tables during each emulation step.

In certain embodiments, the first set of lookup tables comprise lookup tables with four inputs. In some embodiments, the second set of lookup tables comprise lookup tables with three inputs. In certain embodiments, the data array comprises a plurality of data memories having four ports.

In some embodiments, at least one of the ports of at least one of the plurality of data memories is bidirectional. In certain embodiments, at least one of the ports of the data memory operates twice per clock cycle.

In one form, an emulation chip comprising a plurality of hardware functional verification resources is provided, an emulation processor cluster of the emulation chip comprising: a first plurality of lookup tables; a second lookup table; a data array to store a plurality of lookup table select bits to be provided to the first plurality of lookup tables and the second lookup table according to a plurality of memory read addresses; and an instruction memory to store a set of instructions for each of the first plurality of lookup tables and the second lookup table, wherein each instruction includes a plurality of memory read address bits, a first plurality of lookup table function bits, a second plurality of lookup table function bits, and an indirection enable bit; wherein the indirection enable bit when set causes the first plurality of lookup table function bits to be provided as inputs to the first plurality of lookup tables and causes the second plurality of lookup table function bits to be provided as inputs to the second lookup table, wherein the indirection enable bit when not set causes both the first plurality of lookup table function bits and the second plurality of lookup table function bits to be provided as inputs to the first plurality of lookup tables.

In one form, a method of providing additional lookup tables in an emulation processor cluster of an emulation chip of a hardware functional verification system is provided, the method comprising: providing a plurality of lookup table select bus from a data array to a first plurality of lookup tables and a second lookup table according to a plurality of memory read addresses; storing a set of instructions for each of the first plurality of lookup tables and the second lookup table in an instruction memory, wherein each instruction includes a plurality of memory read address bits, a first plurality of lookup table function bits, a second plurality of lookup table function bits, and an indirection enable bit; when the indirect on enable bit is set, providing the first plurality of lookup table function bits as inputs to the first plurality of lookup tables, and providing the second plurality of lookup table function bits as inputs to the second lookup table; wherein the data array comprises a plurality of data memories, wherein the data memories output the second plurality of lookup table function bits to the second lookup table over every other emulation step; and when the indirection enable bit is not set, providing both the first plurality of lookup table function bits and the second plurality of lookup table function bits as inputs to the first plurality of lookup tables.

These and other objects, features, aspects, and advantages of the embodiments will become better understood with reference to the following description and accompanying drawings.

BRIEF DESCRIPTION OF THE DRAWINGS

The accompanying drawings, which are included as part of the present specification, illustrate the presently preferred embodiments and together with the general description given above and the detailed description of the preferred embodiments given below serve to explain and teach the principles described herein.

Figure 1:
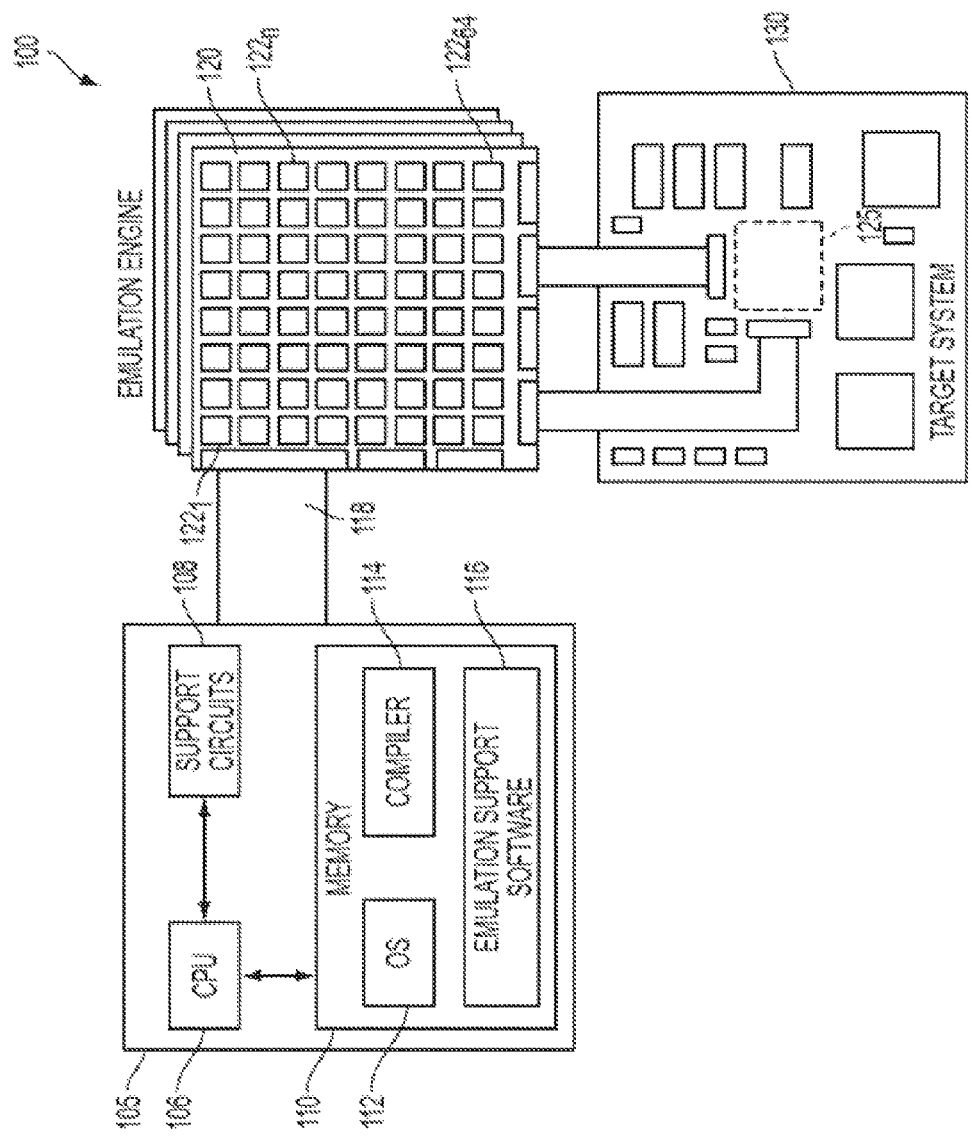
FIG. 1 illustrate an overview of a processor-based emulation system according to an exemplary embodiment.

It should be noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do not describe every aspect of the teachings disclosed herein and do not limit the scope of the claims.

DETAILED DESCRIPTION

A method and apparatus for providing additional lookup tables in an emulation chip of a hardware functional verification system is disclosed. Each of the features and teachings disclosed herein can be utilized separately or in conjunct with other features and teachings. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the various embodiments described herein. However, it will be apparent to one skilled in the art that these specific details are not required to practice the concepts described herein.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm may be here, and generally, conceived to be a self-consistent sequence of steps leading to a desired result. The steps may be those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Also disclosed is an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), erasable programmable read-only memories (EPROMs), electrically erasable programmable read-only memories (EEPROMs), magnetic or optical cards, or any type of media suitable for storing electronic instructions, and each coupled to a computer system bus.

Any algorithms that may be presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the present teachings.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose very possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

FIG. 1 illustrates an overview of an embodiment of a processor-based emulation system 100. The system comprises a host or computer workstation 105, an emulation engine including at least one emulation board 120, and a target system 130. While a processor-based emulation engine is described, though other emulation engines, such as those utilizing arrays of programmable logic devices (such as FPGAs) may also be used, for example properly-configured versions of the systems discussed above.

The host workstation 105 provides emulation support facilities to the emulation engine 100 and emulation board 120. The host workstation 105, for example a personal comper, may comprise at least one central processing unit (CPU) 106, support circuits 108, and a memory 110. The CPU 106 may comprise one or more conventionally available microprocessors and/or microcontrollers. The support circuits 108 may be well known circuits that are used to support the operation of the CPU 106. These supporting circuits may comprise power supplies, clocks, input/output interface circuit cache, and other similar circuits.

Memory 110, sometimes referred to as main memory, may comprise random access memory, read only memory, disk memory, flash memory, optical storage, and/or various combinations of these types of memory. Memory 110 may in part be used as cache memory or buffer memory. Memory 110 may store various forms of software and files for the emulation system, such as an operating system (OS) 112, a compiler 114, and emulation support software 116.

The compiler 114 converts a hardware design, such as hardware described in VHDL or Verilog programming language, to a sequence of instructions that can be evaluated by the emulation board 120.

The host workstation 105 allows a user to interface with the mutation engine 100 via communications channel 118, including emulation board 120, and control the emulation process and collect emulation results for analysis. Under control of the host workstation 105, programming information and data is loaded to the emulation engine 100. The emulation board 120 has on it a number of individual emulation chips, for example the 64 emulation chips $122_1$ to $122_{64}$ (collectively 122) shown in FIG. 1, in addition to miscellaneous support circuitry. There may be any number of emulation chips. The emulation chips 122 are designed to mimic the functionality of any synchronous ASIC design using programmable logic. This is done in order for chip designers to prototype their ASIC design using processor based emulation before having actual silicon in hand. Communication between emulation chips 122 is established via serial I/Os links. There may be numerous output lanes per emulation chip 122. Some of the I/Os links may remain on the card on copper. For longer connections to other cards, the signals may be relayed through optical transceivers and cables.

In response to programming received from the emulation support software 116, emulation engine 100 emulates a portion 125 of the target system 130. Portion 125 of the target system 130 may be an integrated circuit, a memory, a processor, or any other object or device that may be emulated in a programming language. Exemplary emulation programming languages include Verilog and VHDL.

Figure 2:
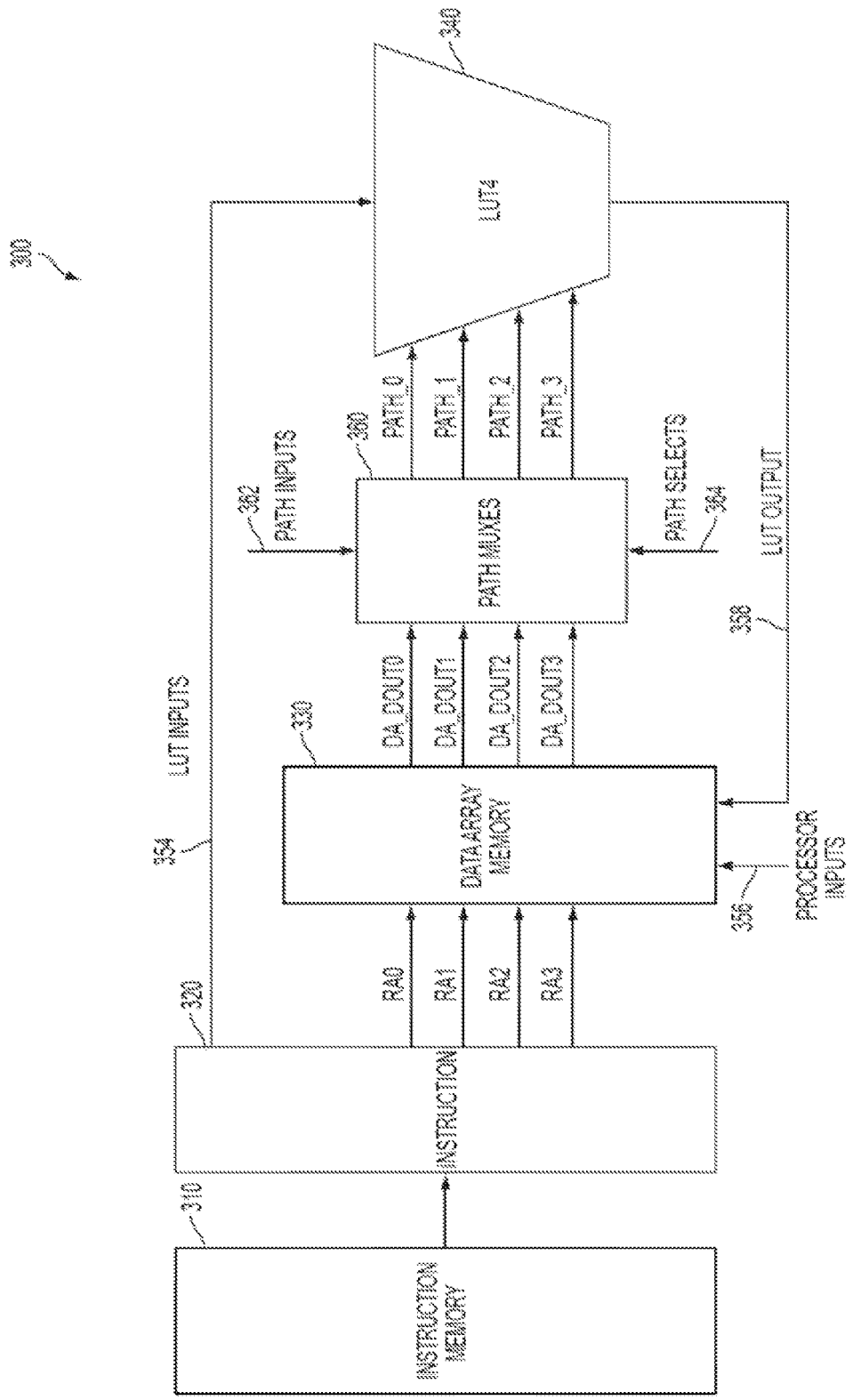
FIG. 2 illustrates a detailed block diagram of an emulation processor according to an exemplary embodiment.

FIG. 2 illustrates a detailed block diagram of a single emulation processor 300 of an emulation chip having a number of processor clusters, and its connections within certain facilities of the processor cluster. In particular, FIG. 2 illustrates an instruction memory 310, instruction decoder 320, data array memory 330, path multiplexers 360, and a four-input lookup table (LUT) 340. As should be appreciated, instruction memory 310, instruction decoder 320 and data array memory 330 may generally correspond to one or more portions of a larger instruction memory, decoder and/or data array memory, respectively.

As shown in FIG. 2, the lookup table 340 is a multiplexer that is provided to execute any Boolean function that has the same number of inputs as the number of select inputs of the multiplexer and to output a single bit result known as a function bit out (FBO), labeled in FIG. 2 as LUT Output 358. For example, a four-way multiplexer has two select inputs and four data inputs. By varying the values of the data inputs, any two-bit Boolean function can be emulated using the multiplexer. A processor cluster may use four-input lookup tables for each emulation processor. 300 in accordance with the exemplary embodiment. Accordingly, these four-input lookup tables can perform any four-bit Boolean function as the basis of its processors. The lookup table 340 evaluates data received from the data array memory 330 using a control store word (CSW) supplied from the instruction memory 310 to produce the FBO. The resulting FBO can correspond to any one of: a logic gate output of the emulated design, a register output of the emulated design, a synthesized intermediate logic state, or a control bit generated for the emulation process.

As discussed above, the instruction memory 310 contains the instructions (i.e., control store words) for the lookup table 340 in the processor cluster, which are passed to the lookup table 340 from the decoder 320 as LUT inputs 354. In particular, emulation of a chip design is achieved by repeatedly running a set of these instructions. Each pass through the instruction memory 310 (i.e., a cycle) results in the equivalent number of lookup table operations. Using the depth of the instruction memory 310 and multiplying this by the size of the lookup table (e.g., a 4-input lookup table) results in the overall capacity of the system. Accordingly, if the instruction memory 310 has eight locations, one cycle would result in emulation processor 300 executing eight lookup table 340 operations.

A data array block may contain the data memory of the processor cluster and may be implemented as multiple memories in the exemplary embodiment. Data array memory 330 corresponds to an individual array memory associated with each emulation processor 300 of the processor cluster. In the exemplary embodiment, each data array memory 330 is a static random access memory (SRAM) that is provided to s ore the results of lookup table evaluations (i.e., the LUT output 358) during emulation and inputs to the processor block. According to other embodiments, the data array block may comprise various types of SRAM, or other RAM types. In the exemplary embodiment, the data array memory 300 has a number of single bit read ports that is equal to the number of select inputs of the processor (i.e., four select inputs for the lookup table 340) and one wide write port to write the result of the lookup table evaluations and the processor inputs. The data array memory 330 stores a number of steps (i.e., one step is one clock cycle and the number of steps per cycle corresponds to the program depth) of the lookup evaluation outputs and the processor inputs for subsequent access after emulation to evaluate the functionality and operation of the lookup table 340. The depth of the data array memory 330 is equal to the instruction memory depth.

Figure 3:
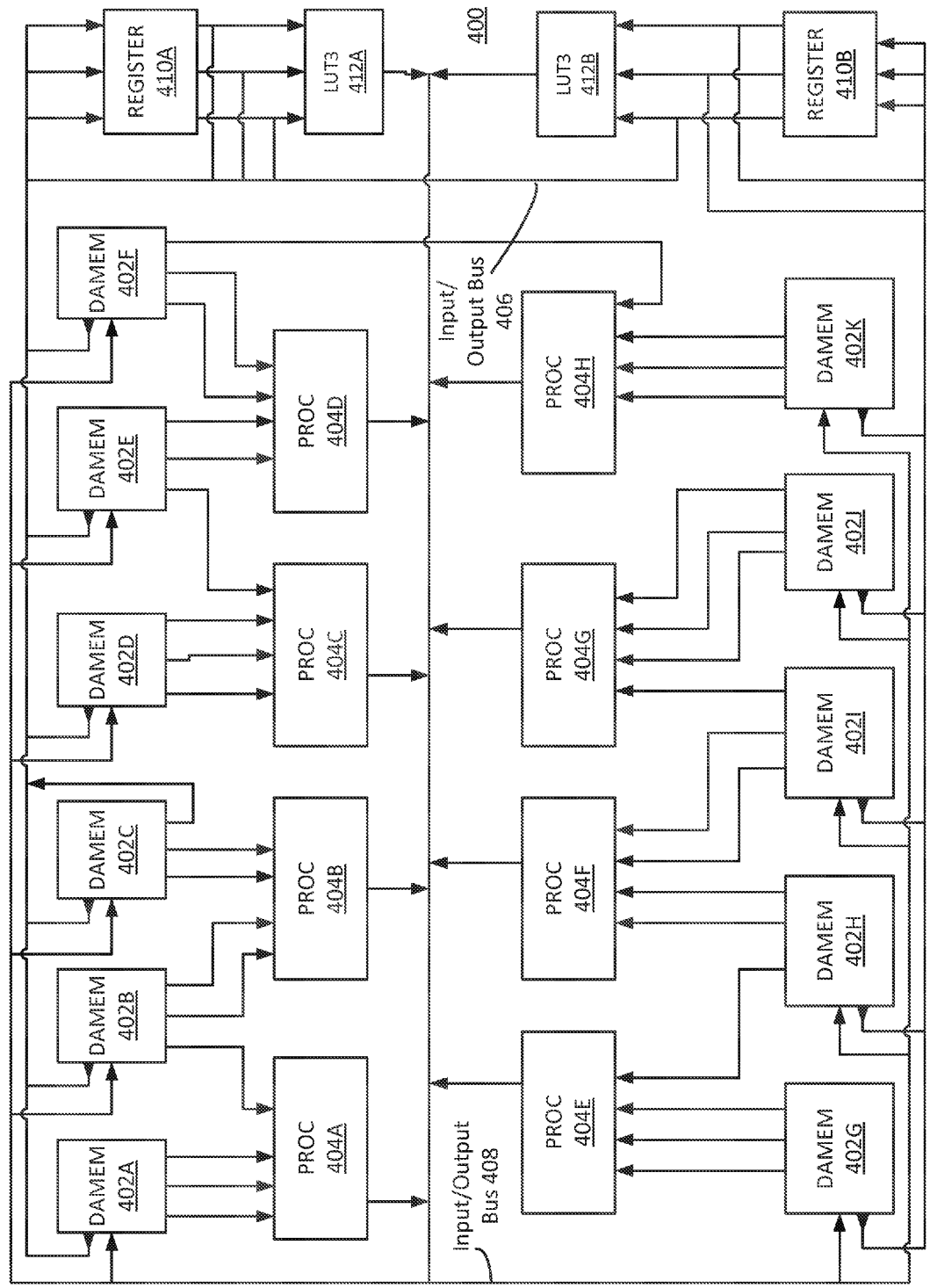
FIG. 3 illustrates an exemplary cluster data array arrangement of the emulation processor of FIG. 2 according to an exemplary embodiment.

The data array block may also contain a number of SRAM memories called data array memories 402 (or DAMEMs), as seen in FIG. 3. These data memories typically store processor outputs and cluster inputs as well as provide read ports to drive bits to the LUTs and communications buses. In an embodiment, each register array SRAM may have four read/write ports. It is further contemplated that in order to satisfy the requirements of the processor cluster 400, each of the eight processors may require four single bit read ports, for a total of thirty-two memory read ports per processor cluster 400. Each memory typically uses at least one write port to write back the results of processor calculations and cluster inputs. It is further contemplated that typically the four ports of the data memories 402 may be configured as having three read ports and one write port. In an exemplary embodiment, since thirty-two read ports are needed, and three read ports are available per data memory 402, at least eleven individual data memories 402 are needed in the data array block, which would provide a total of thirty-three ports, leaving one port available for miscellaneous other functions after the thirty-two memory ports are used for the eight four-input LUTs.

In general, it should be appreciated that each individual processor has a limited capacity (e.g., 1280 gates) and, therefore, would not be useful for emulation of a current multi-million gate design. As a result, the eight processors of a processor cluster work in a group. To do so, these processors communicate with each other by sending their respective lookup table evaluations to the other processors. The better the communications channel (for example including high bandwidth and low latency), the more efficiently the processors will be used with less time wasted waiting for data from other processors. The most efficient communications channel is the data array memory 330. Thus, in the exemplary embodiment, all processors of the processor cluster may share the same data memory. The data memory itself may be implemented as multiple individual memory blocks that work together as a single data array memory 330. For example the memory blocks may comprise a number of discrete IP blocks configured to work together as one or more data arrays. As shown in FIG. 2, the data array memory 330 includes processor inputs 356, which are inputs from other processors in the processor cluster, and is also coupled to LUT output 358 to receive the output evaluations of the lookup table 340.

As further shown, the data array memory 330 has multiple read ports, e.g., four read ports (DA_DOUT0 through DA_DOUT3), that provide input data to the lookup table 340 via the path multiplexers 360. The path multiplexers 360 are used to select the inputs provided to the lookup table 340 and can also can also be used to chain lookup table operations in a single step. As noted above, each lookup table 340 is essentially a sixteen-way multiplexer that receives its sixteen inputs from the decoder 320 as LUT inputs 354. In addition, the four-bit select inputs (Path_0 through Path_3) come from the path multiplexers 360. In normal operation, these multiplexers provide the data address outputs (DA_DOUT0 through DA_DOUT3) from the four read ports of the data array memory 330 as the four-bit select inputs of the lookup table 340. However, the path multiplexers 360 can also provide other types of inputs (i.e., path inputs 362) to the lookup table 340 to significantly improve the flexibility of the lookup tables in the processor blocks of the processor cluster.

The path multiplexers 360 are configured to enable the processors in the processor cluster to receive inputs other than DA_DOUT (e.g., path inputs 362) from the respective data array memory 330 as well as for the purpose of chaining multiple function tables (FTABs) together so that they can execute in a single step. The output of the path multiplexers 360 are controlled by input signals via path selects 364. The path multiplexers 360 are also provided to feed additional types of data into the lookup table select inputs.

As shown in FIG. 2, the lookup table 340 includes multiple select input ports to receive select inputs Path_0 through Path_3. As noted above, each of these select input ports corresponds to a read port of the data array memory 330 DA_DOUT0 through DA_DOUT3). However, during emulation, the lookup table 340 does not always require all of the input data supplied from the data array memory 330 during a particular emulation step. For example, during an emulation step the lookup table 340 may only utilize data supplied from three read ports of the data array memory 330 (e.g., DA_DOUT0 through DA_DOUT2) and the data from the fourth read port (e.g., DA_DOUT3) is unused.

FIG. 3 illustrates an emulation processor cluster 400 according to an embodiment. A processor cluster may be a collection of emulation processors and other circuitry of an emulation chip 122n within the processor-based emulation system 100 described above with respect to FIG. 1. The emulation chip 122n may be designed hierarchically, such that each individual emulation processor at the bottom hierarchy level is organized as part of a cluster of emulation processors, which may be further organized into larger clusters. FIG. 3 illustrates an embodiment of a processor cluster 400 comprising a number of eight four-input emulation processors and two three-input emulation processors among other circuitry and memories to form a first hierarchical level emulation processor cluster in an emulation chip.

In the embodiment shown in FIG. 3, the functionality at both emulation step N and emulation step N+1 is shown. Typically, hardware functional verification systems sequentially evaluate combinatorial logic levels, starting at the inputs and proceeding to the outputs, where each pass through the entire set of logic levels is known as a cycle and the evaluation of each individual logic level is known as an emulation step.

When indirection is enabled, during an even-numbered emulation s N, the data memories DAMEM 402A through 402K (collectively data memories 402) receive read address input bits from an instruction for that emulation step via an input/output bus 408. Bits from the data memories 404 are sent to the eight LUT4 processors 404A through 404H (collectively processors 404) from the data memories 404 according to the read address input bits. At step N, each processor 404 receives four inputs from the data memories 402. The processors 404 may receive inputs from a combination of individual data memories 402.

According to the exemplary embodiment illustrated in FIG. 3, the data memories 402 comprise four-port memories, with at least one bidirectional port (used for the input/output bus 408), and three output ports for the processors 404. All four ports may be bidirectional. In addition other types of data memories 402 may be used together as a data array memory for processor cluster 400, each data memory having greater or fewer numbers of input, output, and/or bidirectional ports, which may be configured to take the different numbers and types of ports into account. According to another embodiment, the data memories may comprise two physical ports that each operates twice per clock cycle so that each data memory may be used as a four port data memory. Different types of data memories may also be used within the data array memory, for example where data memory 402A has a different number of ports than data memory 402B.

During an odd-numbered step N+1, the processors 404 each send one output to the input/output bus 408, which is now logically connected as illustrated by input/output bus 406. The physical connections do not change between an even-numbered step N and an odd-number step N+1, but while the data memories 402 receive data bits from the input/output bus 408 on even-numbered steps N, the data memories may instead transmit data bits to input/output bus 408 on the odd-numbered steps N+1, which is illustrated as input/output bus 406. Input/output bus 406 and put/output bus 408 are actually connected to the same memory port for a given data memory 402. The routing circuitry has been omitted from FIG. 3 for clarity.

During the odd-numbered step N+1, when indirection is enabled, the data memories 402 output to the extra LUTs 412 via input/output bus 406, and to a set of registers 410. Six of the bits from data memories 402 are routed to the two extra LUTs 412, from which an output may be sent back to the input/output bus 408 along with the outputs of the processors 404. In addition to the six bits used by the extra LUTs 412 during the odd-numbered steps, another six bits may be stored into the registers 410 during the odd-numbered steps N+1 for use during the next even-numbered step N. Registers 410 need only store the six bits for a single step. Thus, the extra LUTs 412 may be provided with inputs during both the even steps N and odd step N+1, even though the memory port of data memories 402 are unavailable to the extra LUTs 412 during the even steps N.

When indirection is disabled, the instruction bits are not sent to the register 410 or extra LUTs 412.

The processor cluster is typically capable of being configured to have LUTs of various sizes and functions. In some embodiments, the LUTs also may have the capability to forward the results of their evaluations as the inputs to other LUTs in the same processor cluster within the same step. It is further contemplated that in some embodiments, the LUTs may operate similarly to a shift register.

In an exemplary embodiment, an extra LUT 412 (a supplemental LUT3) may be available along with the already available LUTs, such as the processors of PROC blocks 404. It is further contemplated that the processors 404 are typically LUT4s. In one such an embodiment, there may be one extra LUT 412 for every four regular processors. This extra LUT 412 may receive inputs from DA_DOUT multiplexers, bypass multiplex s, or data array ports depending on the mode. The output of the extra LUT 412 is typically fed to the bypass multiplexers of the processor inputs as well as the input and NBO multiplexers. The output of the extra LUT 412 may or may not be stored in the data array automatically. It is further contemplated that if a value needs to be stored in the data array typically an input multiplexer path is used. In other embodiments, other size LUTs may be used as the supplemental LUTs.

The inputs of the extra LUT 412 typically depend on an instruction, which may be referred to as "indirection," being enabled or not. If instead of using the function table for the LUT ("FTAB") field of the control store word ("CSW") directly, a table of FTAB values is used to select which FTAB to use, and then typically 75-90% of all FTABs can be accommodated with a table of size sixteen, for example. In some embodiments, one bit may be added to the CSW to indicate that indirection is enabled. When indirection is enabled, i.e. that bit is set to "I", the FTAB that may be used by the LUT comes from the table rather than directly from the CSW FTAB field. Also, in some embodiments, when the indirection bit is set to "1", four out of the sixteen bits of the FTAB are used to index the FTAB indirection table and select one sixteen-bit value which may then become the FTAB for the current processor at this step. In other embodiments, other table sizes and number of bits may be used.

In other embodiments, the FTAB field of the instruction may be used only to address a first FTAB table when indirection is enabled or a second FTAB table when indirection is not enabled. That is, the LUTs may be fed always from FTAB tables addressed by the instructions, but not directly from the instruction. This approach may save a number of bits from the instructions.

When indirection is enabled, it is contemplated that a certain number of bits in the FTAB field may not be used. For example, when indirection is enabled twelve bits of the sixteen bits in the FTAB field may not be used. These extra bits may then be used for other purposes, such as for the extra LUT 412 functionality. Typically, the indirections of four processors at a time are examined by each extra LUT 412. If there are no indirections in the four processors on a particular step, the extra LUT 412 can do a LUT3 operation hut the inputs may then come from three sixteen-way multiplex s that can select from the sixteen DA_DOUTs available in the set of four processors. If there is one indirection in the four processors on a particular step, the extra LUT 412 can receive two of its inputs from data array outputs and the last input from a sixteen-way multiplexer that can select from the sixteen DA_DOUTS available in that set of four processors. The extra bits freed up in the FTAB field in the instruction where indirection is enabled may be used to provide increased flexibility to the LUT 412 inputs. These extra bits may also be used for other purposes in the processor cluster, for example to enable special features or enhance other features.

Where there are two indirections in the set of four processors, then all three inputs of the extra LUT 412 may be fed from data array outputs. This is because where indirection is enabled for at least two of the four processors, there may be sufficient bits in the two instructions to provide addresses to the described data array ports. The extra bits freed up in the unused portions of the FTAB fields in the instructions are used to create an address for the data array read ports used to feed extra LUT 412.

Figure 5:
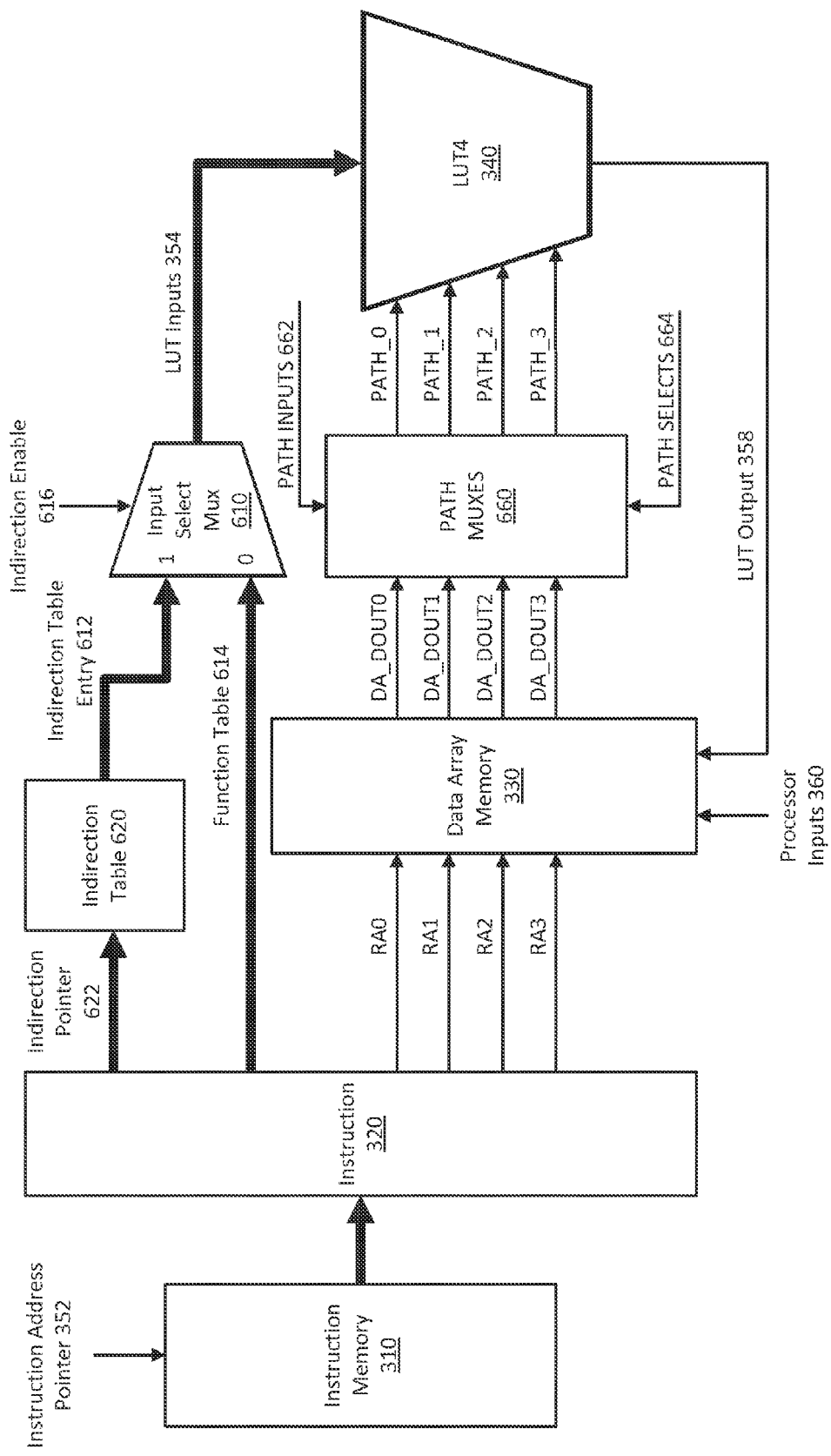
FIG. 5 illustrates a block diagram of portions of an emulation processor, including an indirection table for a lookup table according to an exemplary embodiment.

As illustrated in FIG. 5, when indirection is enabled the function table for LUT4 340 may be provided by an indirection table 620 that is part of the processor cluster registers. The indirection table 620 stores the function table used by the LUT4 340 during processing. The table can be looked up and an indirection table entry 612 selected according to an indirection pointer 622. The indirection point 622 is a portion of the FTAB field of instruction 320. When indirection is not enabled, i.e. indirection enable bit 616 has a "0" value, for the exemplary LUT4, the sixteen bit FTAB field of instruction 320 would normally be selected by input selection multiplexer 610 to provide the LUT inputs 354 to LUT4 340. When indirection is instead enabled, i.e. bit 616 has a value of "1", indirection point 622 uses four bits of the sixteen bit FTAB field. Path multiplexers 660 are configured to enable LUT4 240 to receive inputs other than DA_DOUT0, DA_DOUT1, DA_DOUT2, and DA_DOUT3 (e.g., path inputs 662) from the respective data array memory 330. The output of the path multiplexers 660 are controlled by input signals via path selects 664. The path multiplexers 660 are also provided to feed additional types of data into the lookup table select inputs.

Figure 6:
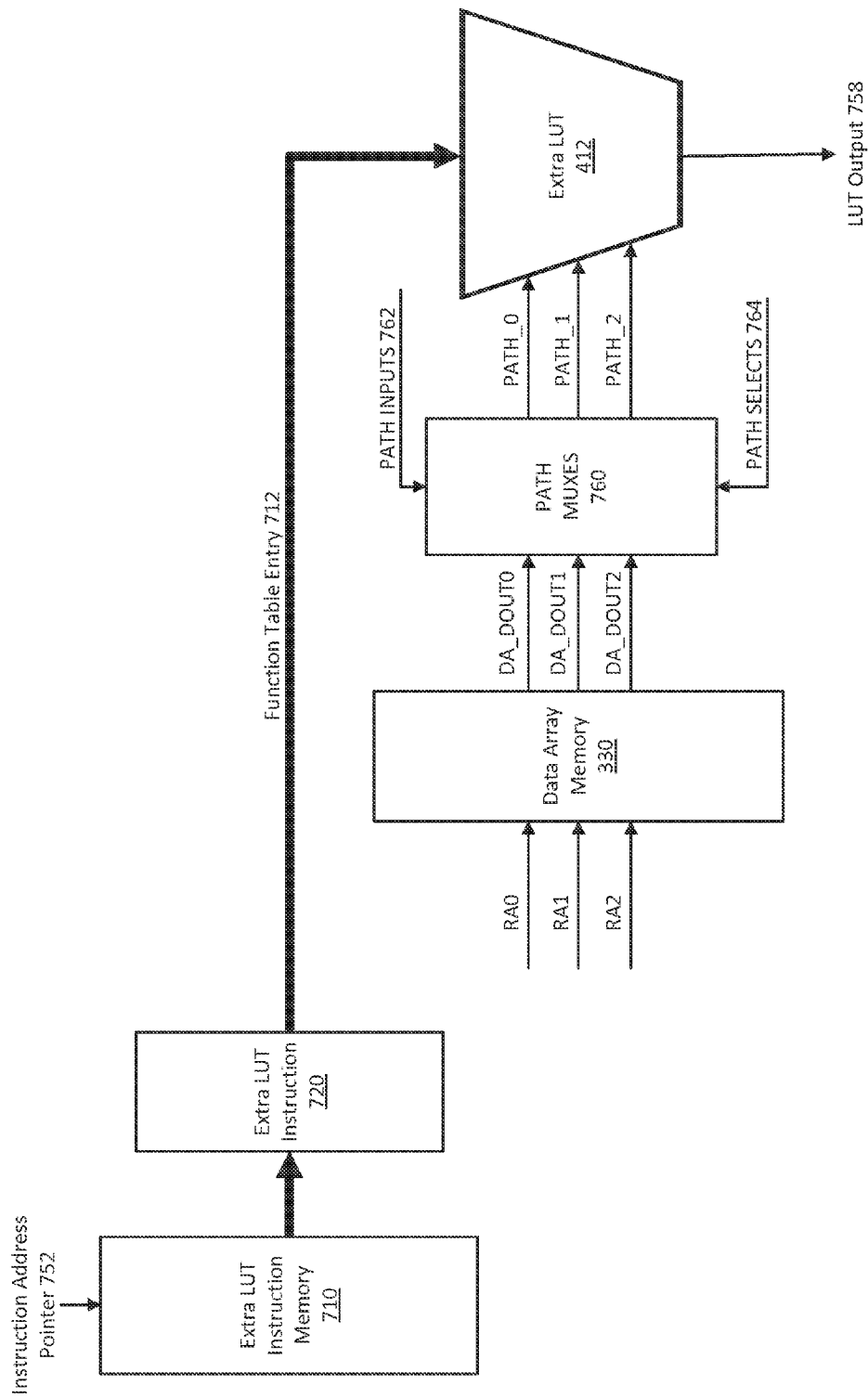
FIG. 6 illustrates a block diagram of portions of an emulation processor, including an indirection table for an extra lookup table according to an exemplary embodiment.

As illustrated in FIG. 6, the function table for the extra LUTs 412 may be provided by function table entry 712 for the extra LUT 412 as part of extra LUT instruction 720 stored in the extra LUT's instruction memory 710. The three read addresses RA0, RA1, and RA2 come from bits in the instructions of the other emulation processors which have had instruction bits freed up when indirection is enabled, as described further above. Though shown as a single memory, data array memory 330 may be one or more separate data memories 402 (402A through 402K), and each of RA0, RA1, and RA2 may come from different data memories 402 (402A through 402K). Path multiplexers 760 are configured to enable the extra LUT 412 to receive inputs other than DA_DOUT0, DA_DOUT1, and DA_DOUT2 from the respective data array memory 330. The output of the path multiplexers 760 are controlled by input signals via path selects 764 from the local extra LUT instruction 720. The path multiplexers 760 may also feed additional types of data into the extra LUT select inputs.

The execution time of the extra LUT is typically after the standard LUT4s, such that any field that feeds the extra LUT functionality programmed at step N, actually executes at step N+1. This means that an output for a regular LUT4 at step N, can be fed, for example via bypass, to an extra LUT 412 programmed in CSW step N.

The extra LUT 412 inputs are normally driven from 16 way multiplexers that are fed by DA_DOUT. These are the same multiplexers that drive a regular LUT4. If there are not enough multiplexers left available to drive the extra LUT 412, the extra LUT 412 then cannot be used. However, when there is at least 1 indirection in the set of 4 processors there are many bits available that are not in normal use that may then be used for driving the extra LUT 412's, as well as for other purposes.

Figure 4:
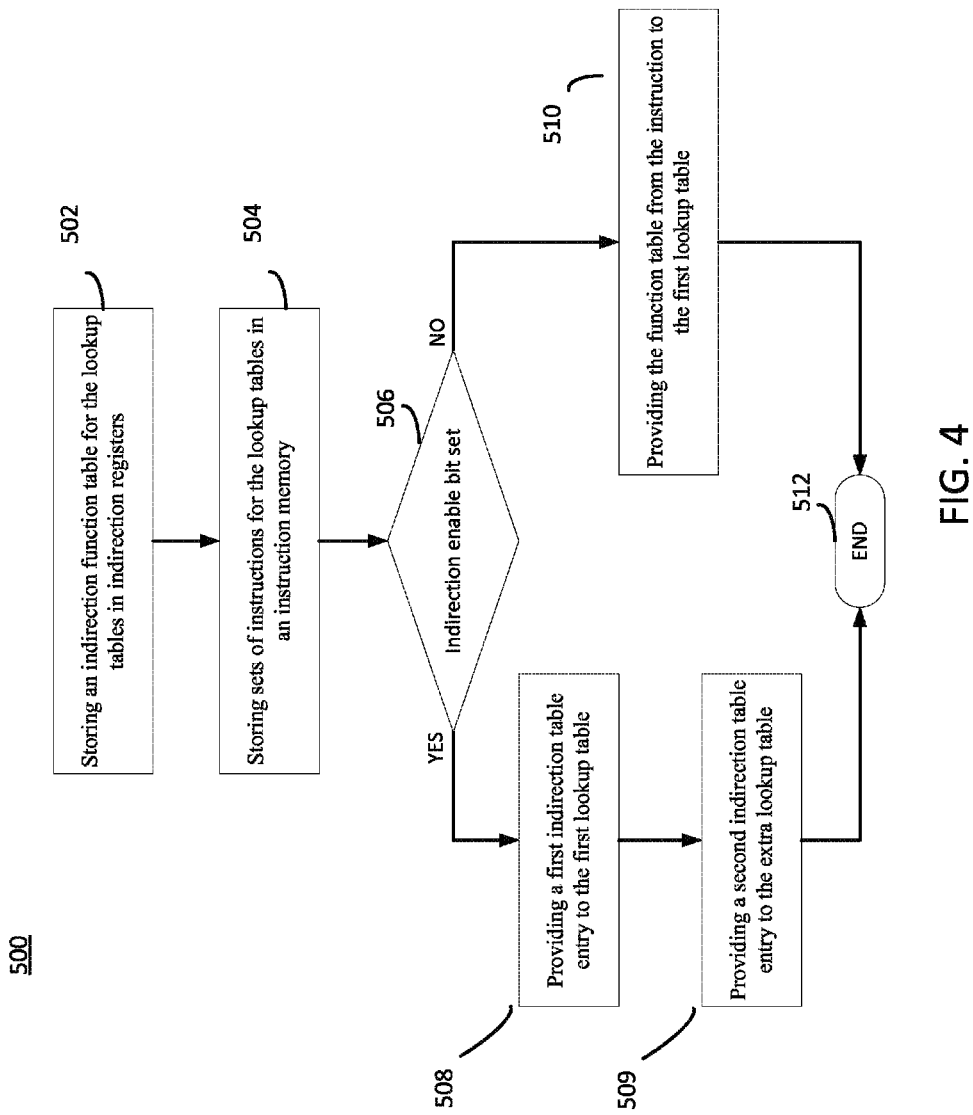
FIG. 4 illustrates a flow diagram of a method of providing additional lookup tables in an emulation processor cluster of an emulation chip of a hardware functional verification system according to an exemplary embodiment.

FIG. 4 illustrates a flow diagram of a method of providing additional lookup tables in an emulation processor cluster of an emulation chip of a hardware functional verification system according to exemplary embodiment. Although not shown, it should be appreciated that this method can be repeated during the emulation process. In other words, once the method ends at step 512, the method may be performed again beginning at the next step during the emulation process.

In an initial block 502, the method stores indirection function tables for lookup tables in indirection registers. The indirection function tables are both for a first plurality of lookup tables as well as a second lookup table. According to another embodiment the first plurality of lookup tables may be LUT4s and the second lookup table may be an extra LUT.

Next, in block 504, the method stores sets of instructions for each of the first plurality of lookup tables and the second lookup table in an instruction memory, wherein each instruction includes a plurality of lookup table function bits and an indirection enable bit. The instructions also contain other bits that are not necessary to describe here.

The method then queries whether the indirection enable bit of an instruction is set, i.e. enabled. If the query is affirmatively answered with the indirection bit being set, in block 508 the method provides a function table entry of the first plurality of function table entries as an input to the lookup table of the first plurality of lookup tables for which the instruction provides a set indirection enable bit. The function table entry may be selected from the first plurality of function table entries according to a first portion of the plurality of lookup table function bits to index that table entry's location in the indirection table.

If the query is affirmatively answered, then the method in block 508 (which may be concurrent with or precede block 506) provides a function table entry of the second plurality of function table entries as an input to the second lookup table. The function table entry may be selected from the second plurality of function table entries according to a second portion of the plurality of lookup table function bits to index that table entry's location in the indirection table for the second lookup table.

If the query is negatively answered with the indirection bit not being set for an instruction, in block 510 the method provides the lookup table function bits in the instruction as an input to the lookup table of the first plurality of lookup tables corresponding to that instruction.

The method ends at block 512 and can be repeated again during other steps of the emulation process.

As described herein, the use of indirection may be used in conjunction with extra LUTs to provide additional functionality and efficiency. However, they need not both be used together. For example, in other embodiments, indirection may be used to provide more commonly used function tables to LUT when an indirection is enabled, freeing up bits in the instructions for other purposes. One of those purposes may be to provide bits to extra LUTs, but the extra bits could enable other functionality as well. Likewise, in still other embodiments extra LUTs could be provided without the use of indirection to free up bits in the instructions of the other LUTs. Instruction bits could be freed up for use by the extra LUTs for other reasons unrelated to the use of indirection.

The emulation system and method described herein provides the advantage of increasing the capacity of the processors or processor bandwidth by enabling additional lookup tables to be used when needed, thereby minimizing the area used in the processors. As should be appreciated, processor bandwidth significantly affects computational efficiency of a hardware functional verification system. This allows for an increase in the computation per instruction in the processor, while only using a small increase in area used.

Although the embodiments have been described with reference to the drawings and specific examples, it will readily be appreciated by those skilled in the art that many modifications and adaptations of the apparatuses and processes described herein are possible without departure from the spirit and scope of the embodiments as claimed hereinafter. Thus, it is to be clearly understood that this description is made only by way of example and not as a limitation on the scope of the claims.

We claim:

1. A hardware functional verification system having a plurality of hardware functional verification resources and a plurality of interconnected emulation chips, one or more of the emulation chips comprising:

a plurality of emulation processor clusters, one or more of
the emulation processor clusters, comprising:
a first plurality of lookup tables;
a second lookup table;
a data array coupled to the first plurality of lookup tables and the second lookup table;
an indirection register to store a plurality of function table entries for the first plurality of lookup tables and a second plurality of function table entries for the second lookup table to store a first plurality of function table entries for the first plurality of lookup tables and a second plurality of function table entries for the second lookup table; and
an instruction memory to store a set of instructions for the first plurality of lookup tables and the second lookup table, wherein each instruction includes an indirection enable bit;
wherein the indirection enable bit, when set, causes one of the first plurality of function table entries to be provided to one of the first plurality of lookup tables and causes one of the second plurality of function table entries to be provided to the second look up table.

2. The hardware functional verification system of claim 1, wherein an instruction of the set of instructions includes a first lookup table function to be provided to a lookup table of the first plurality of lookup tables when the indirection enable bit of the instruction is not set.

3. The hardware functional verification system of claim 1, wherein the data array comprises a plurality of data memories.

4. The hardware functional verification system of claim 3, wherein the plurality of data memories provide the plurality of function table entries to the first plurality of lookup tables during each emulation step.

5. The hardware functional verification system of claim 4, wherein data memories output the second plurality of function table entries to the second lookup table over every other emulation step.

6. The hardware functional verification system of claim 1, wherein the first plurality of lookup tables comprise lookup tables with four inputs.

7. The hardware functional verification system of claim 1, wherein the second lookup table comprises a lookup table with three inputs.

8. The hardware functional verification system of claim 1, wherein the data array comprises a plurality of data memories each having a plurality of ports, wherein at least one port of the plurality of ports is bidirectional.

9. The hardware functional verification system of claim 8, wherein at least one of the ports of the plurality of ports operates twice per clock cycle.

10. The hardware functional verification system of claim 1, wherein each instruction of the set of instructions comprises the indirection enable bit, wherein the indirection enable bit is set when the indirection enable bit has a binary bit value of 1, and wherein the indirection enable bit is not set when the indirection enable bit has a binary bit value of 0.

11. An emulation chip comprising, comprising:
a first plurality of lookup tables;
a second lookup table;
a data array coupled to the first plurality of lookup tables and the second lookup table;
an indirection register to store a plurality of function table entries for the first plurality of lookup tables and a second plurality of function table entries for the second lookup table to store a first plurality of function table entries for the first plurality of look up tables and a second plurality of function table entries for the second lookup table; and
an instruction memory to store a set of instructions for the first plurality of lookup tables and the second lookup table, wherein each instruction includes an indirection enable bit;
wherein the indirection enable bit, when set, causes one of the first plurality of function table entries to be provided to one of the first plurality of lookup tables and causes one of the second plurality of function table entries to be provided to the second lookup table.

12. The emulation chip of claim 11, wherein an instruction of the set of instructions includes a first lookup table function to be provided to a lookup table of the first plurality of lookup tables when the indirection enable bit of the instruction is not set.

13. The emulation chip of claim 11, wherein the data array comprises a plurality of data memories.

14. The emulation chip of claim 13, wherein the plurality of data memories provide the plurality of function table entries to the first plurality of lookup tables during each emulation step.

15. The emulation chip of claim 14, wherein data memories output the second plurality of function table entries to the second lookup table over every other emulation step.

16. The emulation chip of claim 11, wherein the data array comprises a plurality of data memories each having a plurality of ports, wherein at least one port of the plurality of ports is bidirectional.

17. The emulation chip of claim 11, wherein each instruction of the set of instructions comprises the indirection enable bit, wherein the indirection enable bit is set when the indirection enable bit has a binary bit value of 1, and wherein the indirection enable bit is not set when the indirection enable bit has a binary bit value of 0.

18. A method of providing additional lookup tables in an emulation processor cluster of an emulation chip of a hardware functional verification system, wherein the emulation processor cluster comprises a first plurality of lookup tables, a second lookup table, a plurality of indirection registers, and an instruction memory, the method comprising:
storing an indirection function table in the plurality of indirection registers, wherein the indirection function table comprises a first plurality of function table entries for the first plurality of lookup tables and a second plurality of function table entries for the second lookup table;
storing a set of instructions for each of the first plurality of lookup tables and the second lookup table in the instruction memory, wherein each instruction of the set of instructions includes a plurality of lookup table function bits and an indirection enable bit;
when the indirection enable bit is set for an instruction, providing a function table entry of the first plurality of function table entries as an input to a lookup table of the first plurality of lookup tables, wherein the function table entry is selected from the first plurality of function table entries according to a first portion of the plurality of lookup table function bits; and
when the indirection enable bit is set for the instruction, providing a function table entry of the second plurality of function table entries as an input to the second lookup table, wherein the function table entry is selected from the second plurality of function table entries according to a second portion of the plurality of lookup table function bits.

19. The method of claim 18, wherein an instruction of the set of instructions includes a first lookup table function for a lookup table of the first plurality of lookup tables when the indirection enable bit of the instruction is not set, the method further comprising:

when the indirection enable bit is not set, providing the lookup table function as an input to the lookup table of the first plurality of lookup tables.

20. The method of claim 18, wherein the second lookup table comprises a lookup table that has fewer inputs than each lookup table of the first plurality of lookup tables.

\* \* \* \* \*